United States Patent [19]

Kihm et al.

[11] Patent Number: 4,779,340

[45] Date of Patent: Oct. 25, 1988

[54] PROGRAMMABLE ELECTRONIC INTERCONNECT SYSTEM AND METHOD OF MAKING

[75] Inventors: Douglas P. Kihm; John R. deJong, both of Salt Lake City, Utah

[73] Assignee: Axonix Corporation, Salt Lake City, Utah

[21] Appl. No.: 934,619

[22] Filed: Nov. 24, 1986

Related U.S. Application Data

[63] Continuation-in-part of Ser. No. 593,427, Mar. 26, 1984, abandoned.

[51] Int. Cl.⁴ .......................... H05K 3/02; H05K 1/00
[52] U.S. Cl. ........................ 29/847; 361/398; 174/68.5
[58] Field of Search .............. 361/398; 439/43; 174/88 R, 68.5; 29/830, 832, 846, 847

[56] References Cited

U.S. PATENT DOCUMENTS 3,654,407  4/1972  Kepner et al. .............. 361/398 X
3,683,105  8/1972  Shamash et al. ............ 174/68.5
4,403,272  9/1983  Larson et al. .............. 361/398
4,481,559  11/1984  Buck et al. ............... 361/398 X Primary Examiner—Howard N. Goldberg
Assistant Examiner—Carl J. Arbes
Attorney, Agent, or Firm—Trask, Britt & Rossa

[57] ABSTRACT

A carrier board has electronic circuit components mounted thereon which are conductively connected to carrier board connectors which are in turn interconnected to an interconnect board. The interconnect board has a plurality of first conductors and second conductors that are separated and positioned to intersect to form a plurality of intersections. The first and second conductors may be selectively placed into conductive contact at selected intersect points to thereby form a desired electronic circuit. The interconnect board specifically includes a deformable material between the first and second conductors which are conductively connectable alternately and selectively through the imposition of pressure and temperature.

33 Claims, 6 Drawing Sheets

PROGRAMMABLE ELECTRONIC INTERCONNECT SYSTEM AND METHOD OF MAKING

RELATED APPLICATIONS

This is a continuation-in-part of application Ser. No. 593,427, filed Mar. 26, 1984, which is now abandoned.

BACKGROUND OF THE INVENTION

1. Field

This invention relates to the interconnection of electrical or electronic components into circuits. More particularly, this invention relates to methods, systems and components useful for constructing electronic circuits, including experimental circuits, and for effecting electrical interconnection in electrical systems or circuits.

2. State of the Art

Electronic circuit boards are well known in the art. Typically, the circuit board has a number of different electronic components such as resistors, capacitors and the like, including semi-conductor chips and integrated circuits (IC's), all assembled and interconnected to be an electrical or electronic circuit or a part thereof for use in a particular application. Circuit boards are commonly used today in a wide variety of devices, including televisions, radios, computers, pocket calculators, micro-processors, amplifiers and the like. The ever evolving advancement in the electronic arts, including the development of new electronic devices and circuits therefor, is ongoing.

In the past, a particular function or circuit specification would necessarily need to be translated into a specific circuit design by a circuit designer. The process has in the past involved the development of detailed drawings to reflect the various interconnecting conductors and components followed by the development of an experimental or prototype circuit board which has sometimes been referred to as a breadboard circuit. That is, a one-of-a-kind circuit would be manually constructed by technicians using wires, connectors and the like in order to prove the functionality of the circuit and to determine whether or not the circuit, as constructed, will perform the desired function or meet the desired specifications originally outlined for it.

In recent years, the design of electronic circuits has been facilitated through the development of computer aided design (CAD) systems. That is, the computer is programmed so the circuits may be designed more accurately and more rapidly by the design person. However, even with the use of computer-aided design technology, the breadboard circuit must still be constructed by hand in order to verify that the designed circuits meet the intended function or design specifications.

The construction of an experimental or prototype circuit is typically a complicated and lengthy process. The circuit, as designed, must be manually constructed using components that are soldered onto various boards and then hand wired together as required by the design itself. This is time-consuming and the process can be error prone. After the wiring work is done, one may need to do considerable testing, reevaluation, and in some cases, reworking. After an experimental or breadboard has been verified to be properly assembled, it is then tested to see if the circuit, as designed, really meets the specification or desired function. If not, changes may need to be made and manually incorporated within the involved specification. Eventually, a circuit design is established that is then used as the basis for developing a mass production circuit board in accordance with the experimental board. A variety of processes or systems are used to construct a commercialized or production circuit board which are not here involved.

In view of the considerable cost associated with the construction and testing, and thereafter reworking of experimental or prototype or breadboard circuits, it is desirable to have a system to construct prototype boards or breadboard circuits more efficiently and with less error. Further, it would be desirable to have a system in which the various circuit connections could be automatically made to minimize, and even avoid, manual soldering of wires and connections to construct an experimental or prototype or breadboard circuit.

In the electrical and electronic arts, it is also frequently required to effect a plurality or matrix of connections through a switch panel or an array of connectors. For example, in telephone systems, it is frequently desired to have an array of connections to interconnect telephones within an office area as well as to permit interconnection to a plurality of outside lines. A switch panel or a switching matrix is presently widely used to affect such connections through the use of a plurality of terminals which are interconnected through a plurality of wires manually connected to the terminals to affect the desired connections. Further, there are numerous other applications in the electrical arts in which electrical systems may from time to time require alternate electrical connections which are affected through matricies of switches or a network of manually made wire connections.

To effect changes to the electrical systems, as above noted, a technician must ordinarily manually make wiring changes which in turn make such changes subject to error. In addition to simple wiring errors, problems can evolve from poor connections, cracked wires and the like. Further, manual wiring activity is time-consuming and in turn expensive.

A system to rapidly and simply affect the connections for such a connector matrix is not available and would be desirable.

SUMMARY OF THE INVENTION

A system for constructing a preselected circuit includes a carrier board with a plurality of electronic components mounted thereto. The components are connected to carrier board connectors via conductors. The system also includes an interconnect board which has a plurality of first conductors which are spaced apart and are in substantial alignment. First conductor connectors are positioned on the interconnect board along an edge thereof and are conductively connected to the first conductors. The interconnect board also has a plurality of second conductors spaced apart and in substantial alignment. The first conductors and second conductors are spaced apart and positioned on the board to intersect in projection to form a plurality of intersect points. The system also includes connection means to conductively connect the carrier board connectors with preselected first conductor connectors. The system also includes connecting means for conductively interconnecting selected first conductors and second conductors at selected intersect points to effect conductive interconnection therebetween to in turn effect connection of the various electronic components to form a preselected circuit.

The first conductors and second conductors are most preferably separated by a deformable material which is also an electrical insulator. The connecting means includes structure to cause the deformable material to deform at the selected intersect point to effect the desired conductive interconnection between the first and second conductors. Preferably, the structure means is a stylus, which is positioned at each of the desired intersect points and which is operable to press the first conductor and second conductor together while at the same time causing the deformable material to deform or move away from the intersect point to effect the desired conductive connection.

The system desirably further includes a computer to generate positioning signals, which are communicated to the connecting means to cause the structure means of the connecting means to operate to cause the first and second conductors at the selected intersect points to be conductively connected.

The structure means of the connecting means preferably includes a stylus and driving means, which are sequentially positioned from intersect point to intersect point by the positioning signal. The computer preferably includes memory means to retain in memory the identity of each of the electronic components and the carrier board connectors associated therewith as well as the identity of the first connectors and the identity of each intersect point, together with means to display such identities.

In yet another embodiment, the deformable material of the interconnect board has the first conductors positioned on the top surface and the second conductors positioned on a bottom surface. The plurality of first conductors are positioned to be substantially parallel to each other and the second conductors are positioned to be substantially parallel to each other. The first conductors and second conductors are spaced apart and orthogonally positioned (that is, normal in projection). The plurality of first and second conductors are also desirably covered with an insulating material.

The interconnect board of the invention may also be constructed to have a core substrate which is deformable and electrically insulating. The first and second conductors are positioned to be substantially in alignment and spaced apart in an orthogonal relationship. The first and second conductors may be conductively connected either under pressure or heat, or both, to deform the substrate and to press the first and second conductors at the desired selected intersect point together to form the desired conductive connection. A weldment material, such as solder, may be positioned between the first and second conductors and the core substrate to facilitate electrical interconnection.

DESCRIPTION OF THE DRAWINGS

In the drawings, which presently illustrate the best mode for carrying out the invention.

DESCRIPTION OF THE PREFERRED EMBODIMENTS

Figure 1:
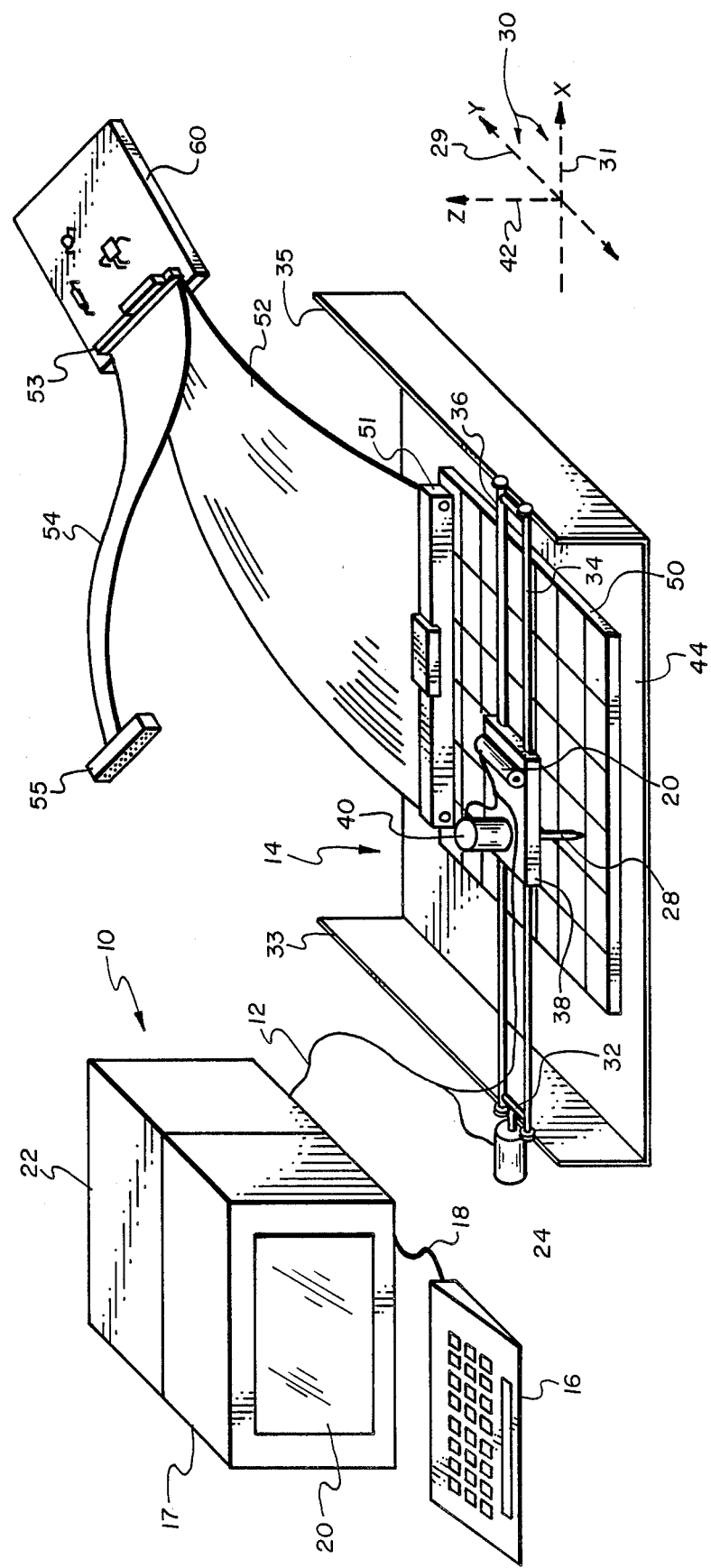
FIG. 1 is a perspective representative view of a system of the instant invention.

Referring to FIG. 1, a system for effecting construction of an interconnect board is shown to include computer means, generally indicated by the numeral 10. The computer means 10 is interconnected by conductor means 12 to connecting means, generally indicated by the number 14, which is here shown to be representative of a conventional X-Y table operable by a computer. The computer means 10 includes a conventional keyboard 16 for operation (input) by the user. The keyboard 16 is interconnected by conductor means 18 in a conventional manner to a computer chassis 17, which is here shown to have a graphic display screen 20, as well as memory means, power supply means and similar standard components 22, as known to those skilled in the art.

The computer means 10, together with its associated components, may be an IBM personal computer or any other computing device which will be recognized by those skilled in the art as capable of operating an X-Y table, such as representative table 14. The computer means 10 may be programmed with any number of different programs and desirably is programmed with CAD (computer aided design) software selected for designing electrical or electronic circuits. Acceptable software (computer program) for the computer means 10 includes the "DASH-1" offered by FutureNet Corporation of Canoga Park, Calif.

The X-Y table 14 shown in FIG. 1, is representative of conventionally and commercially available tables. It has a driving means for moving a tool or other device 28, in which those in the art will recognize to be an X-Y plane 30. More particularly, the driving means is here illustrated to include a motor 24 which can operate to drive a carriage arrangement 32 and in turn a pair of horizontally extending rods 34 and 36 along the Y axis or Y direction 29 on tracks or rails 33 and 35. Similarly, the driving means also includes motor 26 which operates to drive a carriage arrangement 38 along the rods 34 and 36 along the X axis or in the X direction 31. The tool 28 is here shown to be operable by a solenoid or similar operating device 40 to cause the stylus 28 to move vertically with respect to the X-Y plane 30, the vertical direction sometimes being referred to by those in the art as the Z axis 42.

Positioned on the work surface 44 of the X-Y table is an interconnect board 50 of the type more fully discussed herein after. The X-Y table 14 can be operated by the computer means 10 in order to position the stylus 28 at various selected points over the interconnect board 50 and to press downward thereagainst to effect an electrical interconnection between conductors of the interconnect board 50, as hereinafter discussed.

The X-Y table 14 illustrated in FIG. 1 is representative of X-Y tables that are widely available. For example, the automatic work station (AWS) manufactured by Automation Unlimited, Inc. of Woburn, Mass. is an X-Y table device which may be suitably adapted to function as the X-Y table 14.

The interconnect board 50 may be interconnected by connection means to a carrier board. The connection means is here shown to include connecting structure 51 and an array of conductors 52 conductively interconnecting to a carrier board 60 by connecting structure 53. Conventional snap connectors with an interconnect strip, such as those presently available from Dowty Electronics of Boonton, N.J., are suitable. Indeed, such connectors may also be used to provid for interconnection of the carrier board 50 and interconnect board 60 to a device for testing. That is, a similar interconnect strip 54 may be interconnected to a pin connector 55 selected to register with a socket arrangement in a test device or in an electronic device (e.g., television, amplifier) for testing after construction as hereinafter set forth.

Figure 2:
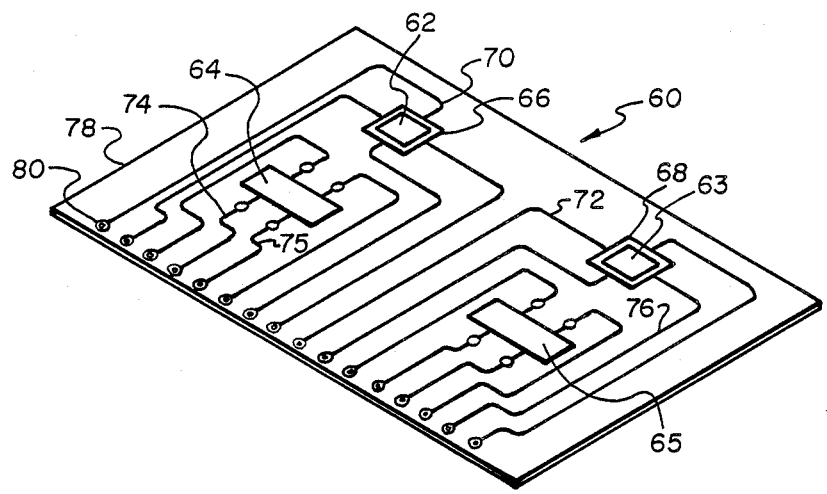
FIG. 2 is a three-dimensional representative view of a carrier board of the instant invention.

Referring now to FIG. 2, one form of the carrier board 60 is illustrated having a plurality of electronic components, such as components 62, 63, 64 and 65 positioned thereon. As illustrated, components 62 and 63 are mounted on the carrier board by insertion into sockets 66 and 68. The sockets have leads extending therefrom, such as leads 70 and 72. Components 64 and 65 have leads which are soldered or otherwise connected in a traditional fashion to conductors, such as representative conductors 74 and 75.

The form of the carrier board 60 shown in FIG. 2, has a plurality of conductors, such as conductors 70, 72, 74, 75 and 76, formed thereon for interconnection with components selected to be mounted to the carrier board 60. The conductors, such as conductors 70, 72, 74, 75 and 76, each extend towards the perimeter 78 of the carrier board 60 to carrier board connectors, such as connector 80, which are at or proximate the perimeter to facilitate interconnection.

The carrier board 60 is here shown to be essentially flat and is preferably made of an electrical insulating material which may be, for example, mylar or any readily available circuit board material. The carrier board 60 has conductors, such as conductors 70, 72, 74 and 76, extending on the top surface to connectors, such as connectors 80. It should be appreciated that other arrangements exist, such as that shown in FIG. 3, which is a cross section of an alternate carrier board arrangement 81.

Figure 3:
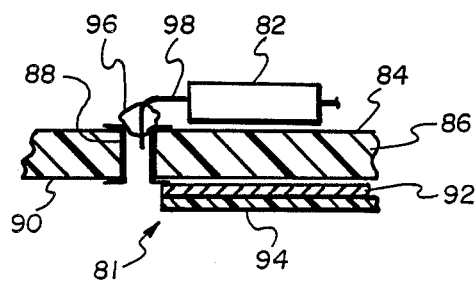
FIG. 3 is a partial cross-sectional view of an alternate carrier board of the instant invention.

As shown in FIG. 3, an electronic component, such as resistor 82, is mounted on the top surface 84 of the carrier board 81, which has as its base an insulating material 86 (e.g., mylar). A conventional thru connection device, which may be regarded as a rivet 88, is formed in the base 86 to act as a conductor to extend from the top surface 84 to the bottom surface 90 of the carrier board. The rivet 88 is connected to a conductor 92 which extends to the perimeter of the carrier board 81 for connection to a carrier board connector (not shown) similar to connector 80 on board 60 (FIG. 2). The conductor 92 is desirably coated with a layer of insulating material 94, as known to those skilled in the art. The resistor 82 is desirably mounted to the carrier board surface 84 by any practical means, including glue, if necessary. It is electrically connected through its respective lead 98 through what is here shown as a drop of solder 96 positioned to effect an electrical connection between the resistor lead 98 and the rivet 88. The soldering of the leads of a component may be sufficient to securely mount the component to the board 81.

The conductors 70, 72, 74 and 76 (FIG. 2), as well as the conductor 92 and rivet 88, may be made of any acceptable conductive material and are preferably made of copper or a copper alloy.

Figure 4:
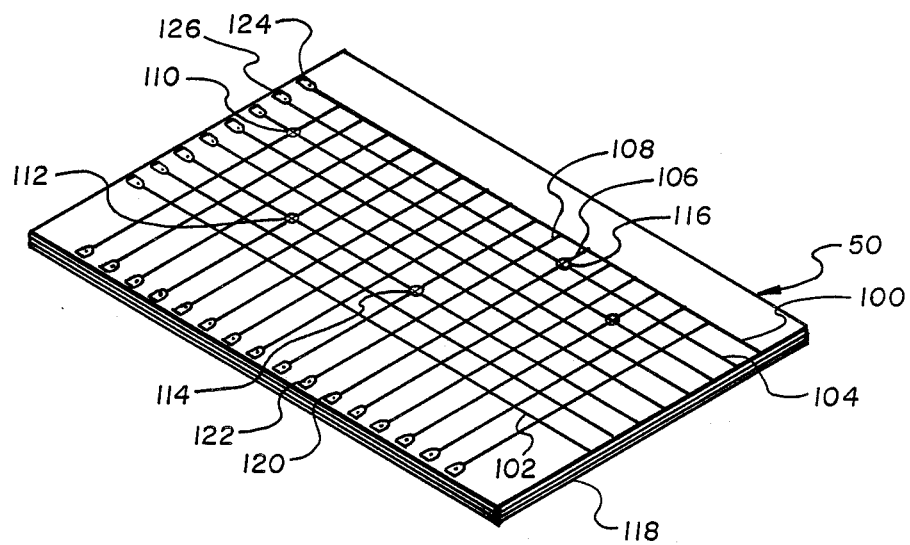
FIG. 4 is a perspective simplified view of an interconnect board of the instant invention.

Referring now to FIG. 4, the interconnect board 50 is shown with a simplified interconnect array or matrix. More particularly, the interconnect board 50 has a plurality of first conductors (secondary lines), such as conductors 100 and 102. These conductors are shown to be spaced apart and to be substantially in alignment, as shown, to avoid electrical interference between adjacent conductors such as conductor 100, for example, with its adjacent conductor 104. A second plurality of conductors (source lines), such as conductors 106 and 108, are positioned spaced apart with respect to each other and in substantial alignment to avoid electrical interference between one conductor, such as conductor 108, with its adjacent conductor 106 along their respective lengths. The second plurality of conductors are spaced apart from the first plurality of conductors, as more fully discussed hereinafter.

As can be seen in FIG. 4, the first plurality of conductors and the second plurality of conductors are positioned on the interconnect board 50 with respect to each other to intersect to form a matrix of or plurality of intersect points, such as points 110, 112, 114 and 116.

The second plurality of conductors, such as conductors 106 and 108, are extending toward the perimeter 118 of the board 50 to connectors 120 and 122. Each of the plurality of second conductors similarly extends to and is interconnected to a connector. In an alternate embodiment, the first conductors, such as conductors 104 and 100, may also be connected proximate the perimeter 118 of the board to a corresponding plurality of connectors, such as connectors 124 and 126.

As shown in FIGS. 2 and 4, the relationship of the size of the carrier board 60 and the interconnect board 50 are such that the carrier board connectors, such as connector 80, may be in alignment with corresponding connectors, such as connectors 120 and 122, of the interconnect board 50. Therefore, upon positioning of the carrier board 60 on top of the interconnect board 50, the connector, such as connector 80, and the connectors, such as the connectors 120 and 122, will be in a register and may be interconnected for conductive connection therebetween.

Alternately, the carrier board 60 and the interconnect board 50 may be electrically connected by connection means to conductively connect the carrier board connector, such as connector 80, to the interconnect board connectors, such as connectors 120 and 122. In alternate embodiments, they may also interconnect to connectors, such as connectors 124 and 126.

Figure 5:
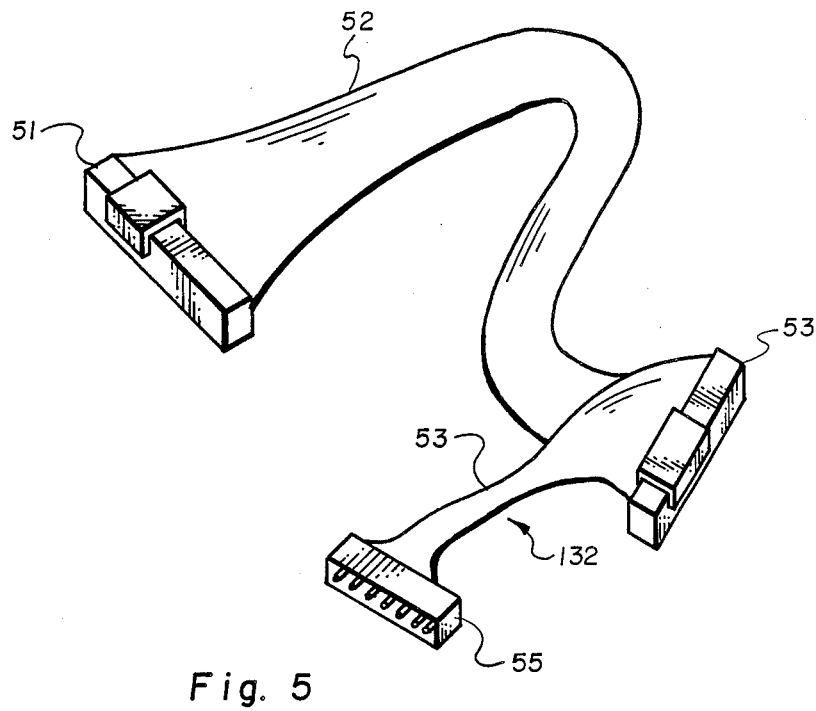
FIG. 5 is a representative illustration of connection means of the instant invention.

FIG. 5 illustrates what may be regarded as an alternate connection means for interconnecting the carrier board connectors of FIG. 2 with the connectors, such as connectors 120, 122, 124 and 126 of the interconnect board 50. As shown in FIG. 5, the interconnect device may be comprised of a mylar strip 54, which has formed therein a plurality of conductors in spaced apart relationship and in substantial alignment to extend between a first connector 51 and a second connector 53. The respective connectors 51 and 53 are each formed in size to effect electrical interconnection with corresponding connectors of the carrier board 60 and the interconnect board 50. A presently commercially available device is made by Dowty Electronics, which includes a snap connecting device Model TS49. Those skilled in the art will recognize that a wide variety of interconnect devices for conductively connecting connectors of one board to another board exist and are readily available for such purpose.

FIG. 5 also shows an external connector 132. It includes a flexible mylar strip 53 with a plurality of conductors interconnecting between the connector 53 and an external connector 55. The external connector 55 is here shown to be a multi-pin array connector. Those skilled in the art will recognize that multi-pin arrays in various sizes (e.g., 50 pins, 100 pins) are readily available for use in a particular circuit arrangement.

Figure 6:
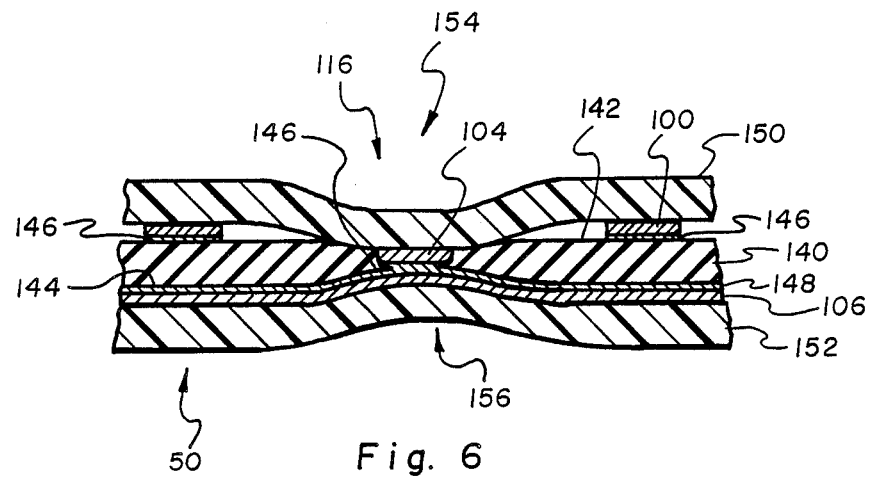
FIG. 6 is a partial cross-sectional view of an interconnect board of the instant invention at an intersect point.

Referring now to FIG. 6, a partial cross section of the interconnect board 50 is shown. The board 50 has a core substrate 140 which is an electrical insulating material that is deformable and preferably inelastically deformable. The core substrate 140 has a top surface 142 and a bottom surface 144. The top surface 142 has positioned thereon the plurality of first conductors, such as conductors 100 and 104. The bottom surface 144 has positioned thereon the plurality of second conductors, such as conductor 106. Preferably, the first conductors have interspaced between the top surface 142 and the conductor 100 an electrical weldment material, such as solder 146. Similarly, second conductors have interspaced between the bottom surface 144 of the conductor an electrical weldment material, such as solder 148. The plurality of first conductors and second conductors, such as conductors 100, 104 and 106, are preferably covered by an insulating material, which is here shown to be insulating material 150 and 152. Here, again, a mylar-type material may be used.

Core substrate 140 is eeformable both under either pressure or heat, or both. The core substrate 140 is selected to preferably have a melting point lower than the first insulating material 150 and the second insulating material 152. An appropriate core substrate material can be, for example, Seal Bright.

The insulating materials 150 and 152, as noted, are also deformable in an inelastic fashion. That is, under pressure or under the application of heat, or under the application of both heat and pressure, the material 150 and 152 deforms and stretches without separation. Upon application thereof, the core substrate 140 moves or flows away from the intersect point involved as the conductors are pressed towards each other and into electrical connection.

The conductors 104 and 106 are made of a material such as copper or a copper alloy which is deformable without separation. That is, the material will in effect stretch along its length when pressure is applied. The electrical weldment material, such as solder 146 and 148, is, of course, selected to have an appropriate melting point desirably slightly above (about plus 20° F.) the melting point of the core substrate 140, but yet lower than the melting point of both the first and second insulating materials 150 and 152.

In the presently preferred arrangement, the core substrate 140 is an inelastically deformable material that flows upon the application of pressure when heated. The conductors 104 and 106 are made of a copper alloy and will stretch along their lengths under pressure normal thereto and will stretch more easily if they are heated. The solder material 146 and 148 is preferably acidless conventional solder. The insulating material 150 and 152 is preferably a mylar that is inelastically deformable and stretchable upon the application of pressure when heated, but yet does not melt or flow to the same degree as core substrate 140. In effect, the melting point of the insulating material 150 and 152 is higher than core substrate 140.

To effect a connection between conductors at an intersect point, such as conductors 104 and 106 at intersect point 116, pressure essentially normal to the surface is applied by a tool such as stylus 28 (FIG. 1). The heating of the core substrate 140, the conductors 104 and 106, solder material 146 and 148, and insulating material 150 and 152 may be achieved at the intersect point 116 by heating the tool (stylus 28). That is, the tool may be a soldering gun tip with sufficient strength to permit pressure to be applied. Alternately, heat may be applied by blowing hot air at the intersect point or by conducting a current through conductors 104 and 106. Other means of heating may be used, including the use of a directed laser beam or electromagnetic (inductive) radiation. Still alternatively, heat may be applied through a heated metal disc or die positioned opposite the stylus. Alternately yet, the board itself may be heated in or by an oven or similar device. In all cases, however, care must be taken to regulate the heating so that the core substrate 140 flows away from the intersect point 116 under pressure effecting a connection between conductor 104 and 106 without breaking conductors 104 and 106 and without breaking insulating materials 150 and 152. Of course, upon removal of the heat, the heated materials return to their normal state (e.g., solid) at room (operating) temperature.

It should be appreciated that the volume of core substrate 140 that flows away from the intersect point 116 must cause some distension (bubbling) or displacement of the insulating materials 150 and 152. However, the volume involved is relatively nominal in relation to the overall size of the board 50 so that little distention, if any, may be observed.

As shown in FIG. 6, the application of pressure at the intersect point 116 has been from both sides. That is, the pressure may be applied from both sides thereby causing respective indentations 154 and 156, as shown. Also, pressure may also be applied from only one side. A die may be positioned under the interconnect board 50 with a plurality of pressure points which would in turn form an indentation 156 upon the application of heat and pressure at the indentation point 154. As hereinafter discussed, the operation of the stylus 28 of the X-Y table 14 of FIG. 1 is sufficient to cause the indentation 154 and in turn the electrical connection between conductor 104 and 106 and intersect point 116.

In operation, an interconnect board, such as interconnect board 50, is positioned on an X-Y table, such as X-Y table 14 (FIG. 1). The computer means 10, which is preferably a CAD programmed computer, is operated to develop a preselected circuit design, including a list of circuit interconnect points including the identity of the components of the circuit. The identity of the carrier board connectors (e.g., connector 80) when the components are positioned on the carrier board 60 and the identity of the desired intersect points (e.g., point 116) which are to be electrically interconnected to effect construction of the preselected circuit are also developed by the computer means 10. The identity of the connectors (e.g., connectors 120, 122) of the interconnect board 50 interconnected to the connectors of the carrier board 60 are also developed in the computer. The computer means 10 is thereafter operated to develop signals to drive the driving means 24 and 26 of the X-Y table 14 to position structure, such as stylus 28, at the preselected intersect points in a sequential fashion, and at each intersect point to operate the stylus 28. The stylus applies alternately and selectively heat and pressure as hereinbefore discussed at each intersect point, such as intersect point 116, to effect electrical interconnection between the first conductors and the second conductors of the interconnect board 50.

As noted hereinbefore, the computer means 10 may be an IBM personal computer programmed with a FutureNet software package that provides for CAD electronic design. As part of the software package, the computer means generates, when desired, a "net list" which is a listing of each component in the circuit and the interconnections therebetween.

Those skilled in the art will recognize that an addition can be made to software, such as the FutureNet program, to make the desired interconnections. With the net list and the physical characteristics of the interconnect board and the identity of the carrier board leads, the data is all available and need only be processed.

Figure 7:
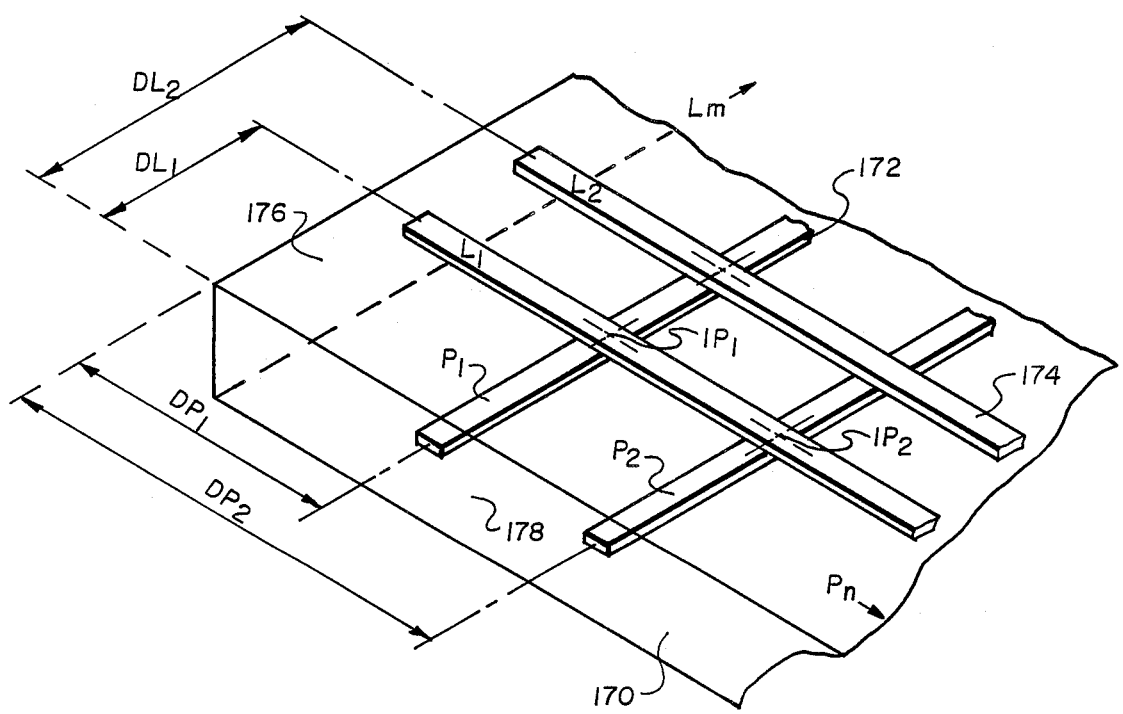
FIG. 7 is an enlarged partial perspective view of an interconnect board of the instant invention.

For example, FIG. 7 is a partial expanded view of a portion of an interconnect board 170. Each primary line 172 of the interconnect board may be assigned a number or designated in sequence $P_1$, $P_2$, $P_3$ to $P_n$ wherein n is the total number of primary lines. Similarly, each secondary line 174 is assigned a number or designated in sequence $L_1$, $L_2$, $L_3$ to $L_m$ wherein m is the total number of secondary lines. The distance of each primary line 172 and each secondary line 174 from the respective edges 176 and 178 of the board 170 to the center of each conductor are known and designated $DP_1$, $DP_2$ to $DP_n$ and $DL_1$, $DL_2$ to $DL_m$, respectively. Each intersect point, such as $IP_1$, $IP_2$ to $IP_x$ wherein x is the total number of intersect points, is thus definable in terms of DL and DP. This information is determined from the physical characteristics of each interconnect board.

Similarly, the identity of each connector on the carrier board 60, such as connector 80 (FIG. 2), is known and can be assigned identities such as $S_1$, $S_2$, $S_3$ and $S_y$ wherein y is the total number of connectors. Further, the identity of the connectors $S_1$, $S_2$ and $S_n$ connected to components mounted on the carrier board is known and can be correlated directly to the interconnect board connectors, such as connectors 120, 122 (FIG. 4), from the selected physical arrangement.

Now with the exact location of the interconnect board on the X-Y table 14 (FIG. 4) known, it can be seen that the stylus 28 (FIG. 1) can be driven to make the necessary connections at the desired intersect points ($IP_1$ to $IP_n$) in accordance with the circuit design preselected by the user in the computer means 10 or CAD system.

Figure 8:
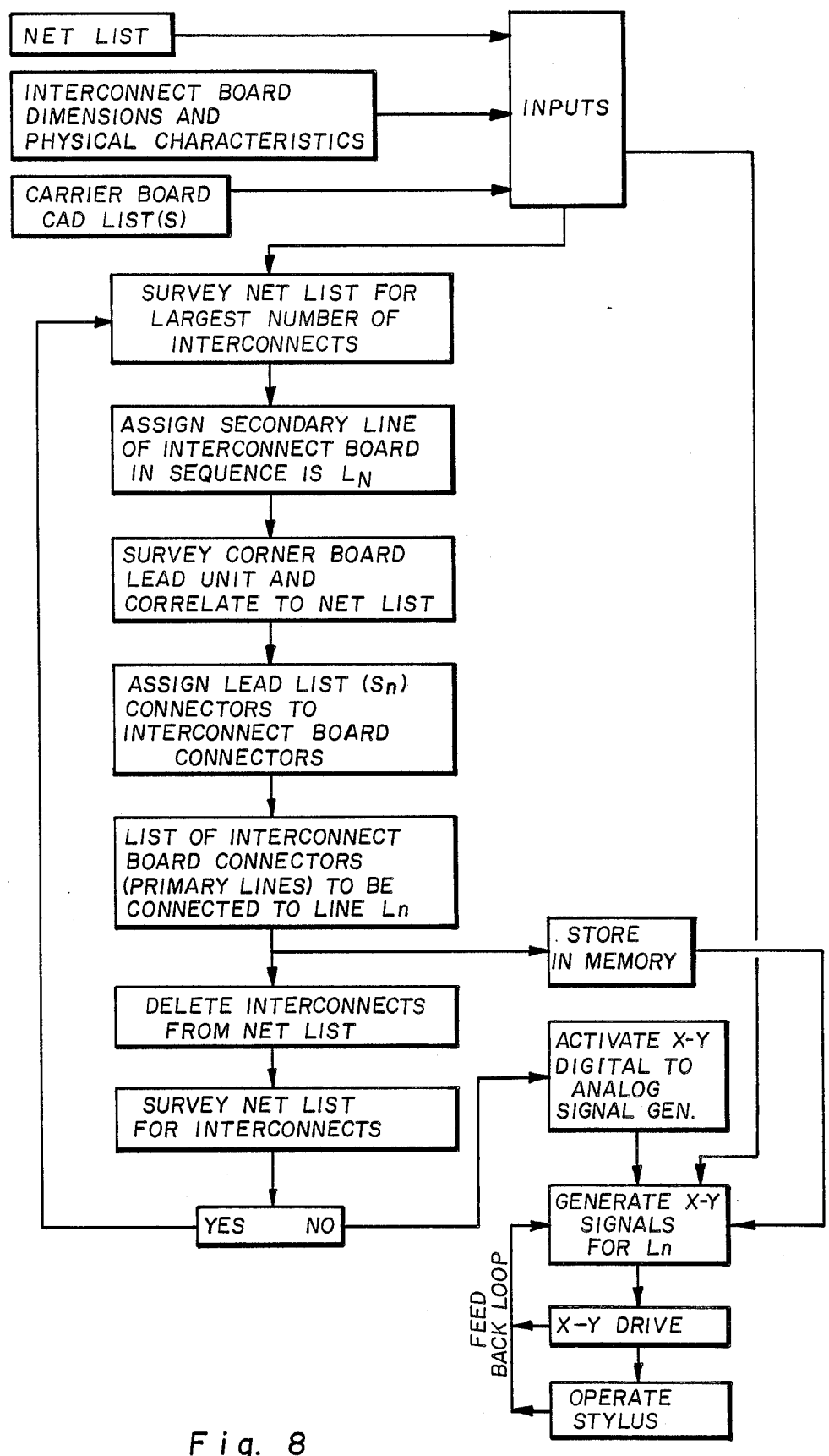
FIG. 8 is a software logic diagram.

FIG. 8 details a representative logic flow for the addition to the existing software. The logic flow may readily be converted into specific program steps and the appropriate machine language.

After the electrical interconnection is effected at the desired or selected intersect points on the X-Y table 14 (FIG. 1), the interconnect board 50 is thereafter removed and interconnected with the carrier board 60 to be an electrical circuit, which may be regarded as an experimental or prototype circuit or a breadboard circuit for subsequent interconnection and testing, as desired.

It should be recognized that interconnect board 50 may be sized as convenient from a very small size (e.g., one inch by two inches) to a substantially large size (e.g., fifteen inches by twenty inches) so that it may be used to effect electrical interconnection between any electrical components on the carrier board 50 connected to, for example, selected first connectors, such as connectors 120 and 122 and second connectors 124 and 126. Preferably, the interconnect board, and also the carrier board, are conventionally sized (e.g, 4 inches by 5 inches). The primary and secondary lines on the interconnect board may be sized to be quite small (from about 0.001 of an inch to about 0.010 of an inch, 1 mil to 10 mils) and are each spaced apart from about 0.001 to about 0.005 inch. The primary and secondary lines may be about 1 mil thick. The core substrate 140 and two insulating material layers 150 and 152 (FIG. 6) of the interconnect board 50 may be each about 3 mils thick. The solder layers 146 and 148 may be about $\frac{1}{4}$ to $\frac{1}{2}$ a mil thick.

It should be noted that the principles of the instant invention may also apply to what those in the art would recognize as macro circuits. That is, for electrical systems in which a matrix of interconnections may be required and may thereafter need to be changed (e.g., security systems, telephone systems), an interconnect board may be used and from time-to-time replaced with a new board to effect desired interconnections.

For example, an interconnect board 50 may be differently sized. That is, for some applications the primary and secondary lines may be considerably larger (e.g., 50 mils thick and 50 mils wide) and similarly spaced further apart. Connections at the various intersect points may be effected as hereinbefore described or even by a manually operated tool such as a soldering gun or heated punch. Alternately, a manually operable punch table may be used, such as the one depicted in FIG. 9.

Figure 9:
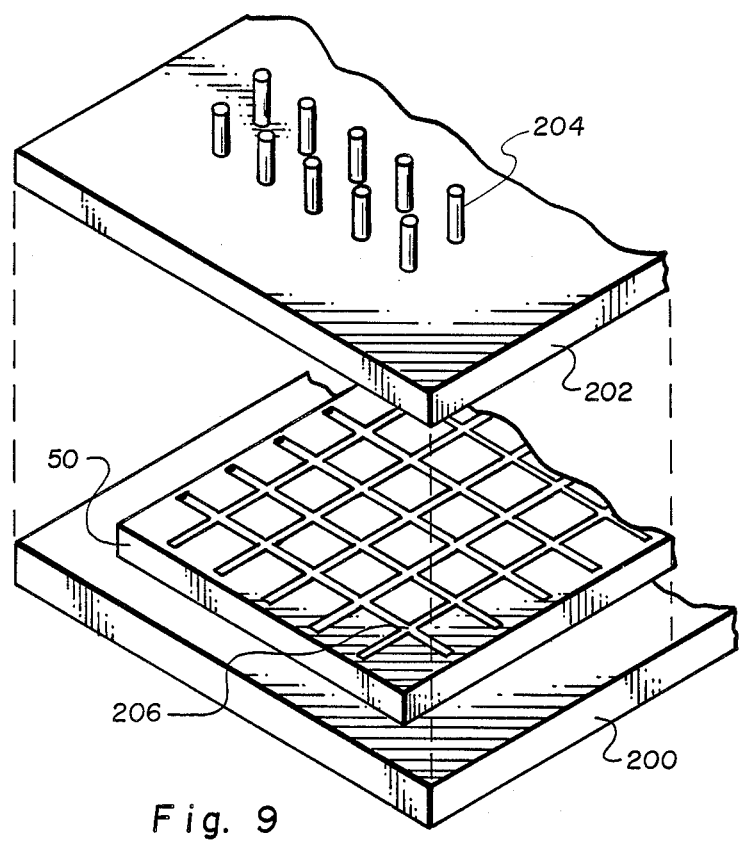
FIG. 9 is a partial perspective view of alternate connecting means of the instant invention.

Referring to FIG. 9, a base 200 has an interconnect board 50 positioned thereon. A top 202 is sized in dimensions to register with the base 200 and in turn align a plurality of punches 204 with each intersect point 206 on the board 50. The punches 204 each may be pressed through the top 202 to contact the appropriate point 206 which is selected to effect the desired connection. Thus, for example, telephone service people could make a new interconnect board at the service site to effect realignment or a newly desired alignment of telephones in a system by either removing an existing interconnect board to make new connections or replacing it with a new one with the desired interconnections.

Figure 10:
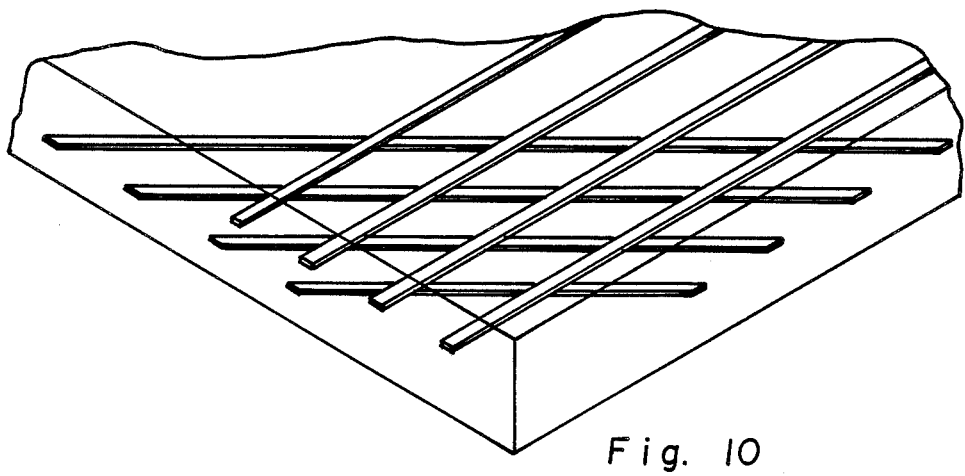
FIG. 10 is a perspective partial view of an alternate interconnect board of the instant invention.

It should be noted that the number of first conductors and second conductors of an interconnect board need not be identical or need they be necessarily oriented in the illustrated normal relationship (see FIGS. 6 and 7). That is, the first conductors may be oriented at an angle to intersect some, but not all, of the second conductors orthogonally, but not normally, in projection (see FIG. 10). It should also be noted that the embodiment illustrated shows only a limited number of first connectors and second connectors. Such has been done to facilitate illustration rather than to indicate the number of connectors positioned on, for example, the core substrate. Since the conductors, such as conductors 102, 104 and 106, are typically only a few mils in thickness or width for electronic circuits, a large plurality may be positioned on the core substrate consistent with the positioning accuracy of the selected X-Y table.

It should also be noted that the interconnect board may have an additional plurality of conductors positioned to intersect both the first and the second conductors as well as additional sets of conductors with the insulating layer 150 and/or 152 being identical to the deformable core substrate 140. That is, those skilled in the art will recognize that within the principles of the instant invention, a plurality of layers of conductors separated by deformable core substrate material may be constructed in order to facilitate electrical connection between two or more adjacent matrices of conductors.

Those skilled in the art will recognize that the above illustrated embodiments are intended to be merely illustrative of the principles of the invention and are not themselves intended to limit the scope of the claims, which themselves define what the applicants seek to claim as their invention.

We claim:

1. A system for constructing a circuit comprising:
   a carrier board having a perimeter and electronic components of a preselected circuit mounted within said perimeter, and having a plurality of carrier board connectors proximate said perimeter conductively interconnected to selected ones of said electronic components;
   an interconnect board having a perimeter and a plurality of first conductors which are spaced apart and substantially in alignment, having first conductor connectors proximate said perimeter conductively interconnected to selected of said first conductors, and having a plurality of second conductors all of which are spaced from all of said first conductors and all of which are spaced apart and substantially in alignment, said first conductors and second conductors being positioned on said interconnect board to intersect in projection to form a plurality of intersect points;
   connection means to conductively connect said carrier board connectors to preselected first conductor connectors;
   connecting means for conductively interconnecting selected first conductors with selected second conductors of said interconnect board at selected said intersect points to effect conductive interconnection therebetween and in turn through said first conductor connectors, said connection means and said carrier board connectors to said electronic components to form said preselected circuit.

2. The system of claim 1 wherein deformable material is positioned between said first conductors and said second conductors of said interconnect board at each intersect point, and wherein said connecting means has structure means to cause said deformable material to deform at said selected intersect points to effect said conductive interconnection of selected first conductors with selected second conductors of said interconnect board.

3. The system of claim 2 wherein said structure means includes a stylus positionable at each of the said intersect points and operable to press said first conductor and second conductor together to effect a conductive connection at said intersect point, and wherein said deformable material is electrical insulating material.

4. The system of claim 3 wherein said deformable material is inelastically deformable and wherein said stylus is operable to effect inelastic deformation of said deformable material.

5. The system of claim 2 further comprising computer means to generate positioning signals reflective of said selected intersect points to form said preselected circuit, wherein said connecting means is conductively connected to said computer means to receive said positioning signals, wherein said structure means of said connecting means processes said positioning signals to operate said stylus to cause said deformable material to deform.

6. The system of claim 5 wherein said structure means includes a stylus and a driving means to sequentially position said stylus at said selected intersect points and to cause said stylus to operate to deform said deformable material and to effect a conductive connection between a said first conductor and a said second conductor at an intersect point.

7. The system of claim 6 wherein said computer means includes memory means to retain in memory the identity of each of said electronic components and the carrier board connectors associated therewith, the identity of the first connectors of said interconnect board connected to said carrier board connectors and the identity of each of said intersect points and the selected intersect points.

8. The system of claim 6 wherein said carrier board has a base made of insulating material having a top and a bottom surface, a plurality of spaced first conductors extending through said base from the bottom to the top surfaces, and a plurality of spaced second conductors extending along said bottom conductively interconnecting said carrier board connectors and said first conductors, and wherein said electronic components are removably mounted to said surface and connected to selected of said spaced first conductors.

9. The system of claim 6 wherein said structure means is an X-Y table.

10. The system of claim 6 wherein said deformable material is a substrate extending to the said perimeter of said interconnect board, said substrate having a top and a bottom, wherein said first conductors are positioned on said top and are substantially parallel, and wherein said second conductors are positioned on said bottom and are substantially parallel.

11. The system of claim 10 wherein said first conductors and said second conductors are substantially normal in projection and wherein said first conductors and said second conductors are covered with insulating material.

12. An interconnect board for use in effecting a plurality of electrical interconnections, said interconnect board comprising:
   a core substrate having a perimeter, a top and a bottom, said substrate being deformable and electrically insulating;
   a plurality of first conductors positioned on the said top of said core substrate, each of said plurality of first conductors being spaced apart from and substantially in alignment with adjacent first conductors;
   a plurality of second conductors positioned on the said bottom of said core substrate, each of said plurality of second conductors being spaced apart from and substantially in alingment with adjacent second conductors and orthogonally positioned on said core substrate with respect to said first conductors to form a plurality of intersect points;
   wherein said core substrate is deformable alternately and selectively under pressure and heat, and wherein said first conductors and said second conductors are alternately and selectively deformable upon the application alternately and selectively of pressure and heat at said intersect points to effect conductive connection; and a first insulator substrate positioned over each of said plurality of first conductors and a second insulator substrate positioned over each of said plurality of second conductors, said first and second insulator substrates being deformable without separation alternately and selectively under pressure and heat at each of said intersect points.

13. The interconnect board of claim 12 further including first electrical weldment material positioned between said core substrate and each of said first conductors.

14. The interconnect board of claim 13 further including second electrical weldment material positioned between said core substrate and each of said second electrical conductors.

15. The interconnect board of claim 14 further including first connectors positioned proximate the perimeter of said core substrate, each conductively connected to a said first conductor for conductive connection to an external conductor.

16. The interconnect board of claim 15 further including second connectors positioned proximate the perimeter of said core substrate, each conductively connected to a said second conductor for conductive connection to an external conductor.

17. The interconnect board of claim 16 wherein said first and second electrical weldment material is a thin coating of solder.

18. The interconnect board of claim 17 wherein said perimeter has four sides arranged so that said core substrate is rectilinear in shape.

19. A circuit board arrangement for assembly of a preselected experimental electronic circuit, said circuit board arrangement comprising:
- a carrier board having a perimeter and electronic components of a preselected circuit mounted within said perimeter, and having a plurality of carrier board connectors proximate said perimeter conductively interconnected to selected of said electronic components;
- an interconnect board having a perimeter and a plurality of first conductors which are spaced apart and substantially in alignment, having first conductor connectors proximate said perimeter to conductively connect to selected of said first conductors, having a plurality of second conductors all of which are spaced from all of said first conductors and all of which are spaced apart and substantially in alignment, said first conductors and second conductors being positioned on said board to intersect in projection to form a plurality of intersect points;
- connection means to conductively connect said carrier board connectors to preselected first conductor connectors of said interconnect board.

20. The arrangement of claim 19 wherein said interconnect board includes a core substrate having a perimeter, a top and a bottom, said substrate being deformable and electrically insulating.

21. The arrangement of claim 20 further including first electrical weldment material positioned on each of said first electrical conductors between said core substrate and each of said first electrical conductors.

22. The arrangement of claim 21 further including first connectors positioned proximate the perimeter of said core substrate, each conductively connected to a said first conductor for conductive connection to an external conductor, and further including second connectors positioned proximate the perimeter of said core substrate, each conductively connected to a said second conductor for conductive connection to an external conductor.

23. A system for making a selected matrix of electrical connections comprising:
- an interconnect board having a perimeter and a plurality of first conductors each of which are spaced apart from and substantially in alignment with adjacent first conductors, having first conductor connectors proximate said perimeter conductively interconnected to selected of first said conductors, and having a plurality of second conductors all of which are spaced from all of said first conductors and each of which are spaced apart from and substantially in alignment with adjacent second conductors, said first conductors and second conductors being positioned on said interconnect board to intersect in projection to form a plurality of intersect points;
- connecting means for conductively interconnecting selected said first conductors with selected second conductors at selected intersect points to effect interconnection therebetween upon application alternately and selectively of pressure and heat at selected of said intersect points to conductively connect selected first and second conductors.

24. The system of claim 23 wherein deformable material is positioned between said first conductors and said second conductors of said interconnect board at each intersect point, and wherein said connecting means has structure means to cause said deformable material to deform at said selected intersect points to effect said conductive interconnection of selected first conductors with selected second conductors of said interconnect board.

25. The system of claim 24 wherein said structure means includes a stylus positionable at each of the said intersect points and operable to press said first conductor and second conductor together to effect a conductive connection at said intersect point, and wherein said deformable material is electrical insulating material.

26. The system of claim 25 wherein said stylus is connected to a source of electrical power and applies heat at said intersect point upon pressing thereat.

27. A system for making a selected matrix of electrical connections comprising:
- an interconnect board having a perimeter and a plurality of first conductors each of which are spaced apart from and substantially in alignment, having first conductor connectors proximate said perimeter conductively interconnected to selected of said first conductors, and having a plurality of second conductors all of which are spaced from all of said first conductors and all of which are spaced apart and substantially in alignment, said first conductors and second conductors being positioned on said interconnect board to intersect in projection to form a plurality of intersect points;
- deformable material positioned between said first conductors and said second conductors of said interconnect board at each interconnect point;
- connecting means for conductively interconnecting selected said first conductors with selected second conductors at selected intersect points to effect interconnection therebetween;
- said connecting means having structure means to cause said deformable material to deform at said selected intersect points to effect said conductive interconnection of selected first conductors with selected second conductors of said interconnect board;

said structure means including a stylus positionable at each of the said intersect points and operable to press said first conductor and second conductor together to effect a conductive connetion at said intersect point;

computer means to generate positioning signals reflective of said selected intersect points to form said preselected circuit; and wherein said connecting means is conductively connected to said computer means to receive said positioning signals and wherein said structure means of said connecting means processes said positioning signals to operate said stylus to cause said deformable material to deform.

28. The system of claim 27 wherein said deformable material is a substrate extending to the said perimeter of said interconnect board, said substrate having a top and a bottom, wherein said first conductors are positioned on said top and are substantially parallel, and wherein said second conductors are positioned on said bottom and are substantially parallel.

29. A method for effecting a matrix of electrical interconnections comprising:

constructing an interconnect board including:

a core substrate having a perimeter, a top and a bottom, said core substrate being deformable and electrically insulating, a plurality of first conductors positioned on the said top of said core substrate, each of said plurality of first conductors being spaced apart from and substantially in alignment with adjacent first conductors, a plurality of second conductors positioned on the said bottom of said core substrate, each of said plurality of second conductors being spaced apart from and substantially in alignment with adjacent second conductors, and orthogonally positioned on said core substrate with respect to said first conductors to form a plurality of intersect points;

a first insulator substrate positioned over each of said plurality of first conductors and a second insulator substrate positioned over each of said plurality of second conductors, said first and second insulator substrates being deformable without separation alternately and selectively under pressure and heat at each of said intersect points; and deforming said core substrate alternately and selectively under pressure and heat and said first conductors and said second conductors alternately and selectively at said intersect points to conductively connect selected said first and second conductors.

30. A method of constructing an experimental electronic circuit comprising:

positioning the components of an experimental electronic circuit on a carrier board which is constructed to have a perimeter and electronic components of a preselected circuit mounted within said perimeter, and having a plurality of carrier board connectors proximate said perimeter conductively interconnected to selected of said electronic components;

positioning an interconnect board proximate said carrier board, said interconnect board having a perimeter and a plurality of first conductors which are spaced apart and substantially in alignment, having first conductor connectors proximate said perimeter to conductively connect to selected of said first conductors, having a plurality of second conductors all of which are spaced from all of said first conductors and all of which are spaced apart and substantially in alignment, said first conductors and second conductors being positioned on said board to intersect in projection to form a plurality of intersect points;

interconnecting said carrier board connectors to said first conductor connectors with connection means;

selectively interconnecting said first conductors to said second conductors at selected intersect points to form said experimental circuit.

31. The method of claim 30 further comprising applying pressure at said selected intersect points.

32. The method of claim 30 further comprising applying heat at said selected intersect points.

33. The method of claim 30 further comprising applying heat and pressure at said selected intersect points.

* * * * *

UNITED STATES PATENT OFFICE
CERTIFICATE OF CORRECTION

Patent No. 4,779,340          Dated October 25, 1988

Inventor(s) Douglas P. Kihm; John R. deJong

It is certified that error appears in the above-identified patent and that said Letters Patent are hereby corrected as shown below:

Column 5, line 11, change "provid" to ---provide---;

Column 7, line 33, change "eeformable" to ---deformable---;

Signed and Sealed this

Eighteenth Day of April, 1989

Attest:

DONALD J. QUIGG

*Attesting Officer*      *Commissioner of Patents and Trademarks*